(12) United States Patent
Abdo et al.

(10) Patent No.: US 8,535,982 B1
(45) Date of Patent: Sep. 17, 2013

(54) PROVIDING AN AUTOMATIC OPTICAL INSPECTION FEATURE FOR SOLDER JOINTS ON SEMICONDUCTOR PACKAGES

(71) Applicants: David F. Abdo, Scottsdale, AZ (US); Pamela A. O'Brien, Chandler, AZ (US)

(72) Inventors: David F. Abdo, Scottsdale, AZ (US); Pamela A. O'Brien, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/689,424

(22) Filed: Nov. 29, 2012

(51) Int. Cl.
*H01L 21/00* (2006.01)

(52) U.S. Cl.
USPC ..... 438/112; 438/123; 257/692; 257/E21.506

(58) Field of Classification Search
USPC ...................................................... 257/E21.5
See application file for complete search history.

(56) References Cited

U.S. PATENT DOCUMENTS

| | | | |
|---|---|---|---|
| 6,608,366 B1 | 8/2003 | Fogelson et al. | |
| 6,611,047 B2 | 8/2003 | Hu et al. | |
| 6,709,892 B2 | 3/2004 | Kobayakawa et al. | |
| 7,023,074 B2 | 4/2006 | Li et al. | |
| 7,105,383 B2 | 9/2006 | Vo et al. | |
| 7,183,630 B1 | 2/2007 | Fogelson et al. | |
| 7,397,112 B2 | 7/2008 | Sato et al. | |
| 7,410,834 B2 | 8/2008 | Fukaya et al. | |
| 7,443,043 B2 | 10/2008 | Sakamoto | |
| 7,932,587 B2 | 4/2011 | Lehmann | |
| 8,017,447 B1 | 9/2011 | Olsen | |
| 2011/0033977 A1 | 2/2011 | Huening | |
| 2011/0108965 A1 | 5/2011 | Hess et al. | |
| 2011/0263077 A1 | 10/2011 | Bai et al. | |

OTHER PUBLICATIONS

U.S. Appl. No. 13/673,212, filed Nov. 9, 2012.

*Primary Examiner* — Cheung Lee
(74) *Attorney, Agent, or Firm* — Jonathan N. Geld (57) ABSTRACT

A mechanism is provided by which optically-inspectable features formed during surface mount bonding of no-leads packages are enhanced. Embodiments of the present invention use a lead frame having features that will lie upon the edges of the finished semiconductor device package, where molding material is prevented from lying in those features through the use of a preplaced film on the lead frame or film-assisted molding in conjunction with a mold chase that conforms to the features provided on the lead frame. Embodiments use a lead frame that has a pre-plated solderable surface, such that the exposed features enhance formation of the optically-inspectable features during solder reflow operations of PCB mounting.

20 Claims, 7 Drawing Sheets

PROVIDING AN AUTOMATIC OPTICAL INSPECTION FEATURE FOR SOLDER JOINTS ON SEMICONDUCTOR PACKAGES

BACKGROUND

1. Field

This disclosure relates generally to semiconductor device packaging, and more specifically, to flat no-leads packages that provide reliable automatic optical inspection cues after the semiconductor device package is soldered to a printed circuit board or other carrier in second level assembly.

2. Related Art

Space concerns in assembling semiconductor devices has led to development of semiconductor device packages that have no leads extending from beyond the perimeter of the package. These packages, such as quad-flat no-leads (QFN and pQFN) packages and dual-flat no-leads (DFN and uDFN) packages, are surface mounted to printed circuit boards (PCBs). The lack of leads extending from the package results in a mounted package consuming less space on the PCB and therefore permitting higher density mounting of packages on the PCB.

The surface mount process used for mounting no-leads packages on a PCB typically uses a solder reflow process that electrically and mechanically bonds the contacts on a no-leads package to contacts on the PCB. Surface tension of the solder to portions of the contacts that have an affinity for solder results in some of the solder extending beyond the edge of the mounted component along the PCB contact, and rising along the edge of the contact of the mounted component away from the PCB. This forms a "toe fillet" that can be automatically optically inspected as an aid in determining whether the contacts of the package and the PCB are bonded.

In a typical no-leads package, the electrical contacts are present on the bottom (or active) surface of the package. To enhance the contacts' affinity for solder, the contacts are often plated with a solderable metal (e.g., gold, silver, nickel, tin, and alloys thereof). During singulation, a portion of an electrical contact is exposed along the side of the package, but most of this exposed portion of the electrical contacts is not plated, but instead may be exposed copper that is subject to oxidization and may also have a rougher surface due to the singulation process. Thus, there may be a lesser affinity for solder on the portion of the contact along the side of the package. This lesser affinity can affect the formation of a toe fillet, and thereby cause the bonded package to fail optical inspection even though the bond of the package to the PCB may be adequate along the active surface of the package. It is therefore desirable to provide a no-leads package that consistently provides for well-formed toe fillets so that bonded parts do not wrongly fail an optical inspection process.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

A mechanism is provided by which optically-inspectable features formed during surface mount bonding of no-leads packages are enhanced. Embodiments of the present invention use a lead frame having features that will lie upon the edges of the finished semiconductor device package, where molding material is prevented from lying in those features through the use of a preplaced film on the lead frame or film-assisted molding in conjunction with a mold chase that conforms to the features provided on the lead frame. Embodiments use a lead frame that has a pre-plated solderable surface, such that the exposed features enhance formation of the optically-inspectable features during solder reflow operations of PCB mounting.

Flat no-leads packages such as quad-flat no-leads (QFN) and dual-flat no-leads (DFN) packages are used to physically and electrically connect semiconductor die to printed circuit boards. QFN packages can be near chip scale encapsulated packages having a lead frame substrate. The package uses perimeter lands on the bottom of the package to provide electrical contact to the printed circuit board (PCB). A die attach paddle can be exposed on the bottom surface of the package to provide a heat path or electrical path when soldered to the PCB. Flat no-leads packages are bonded to a PCB using surface mount techniques.

Surface mount technology commonly is used with a PCB that has flat, tin-lead, silver, or gold-plated copper pads without holes, also called solder pads. A solder paste (e.g., a mixture of flux and solder particles) is applied to all the solder pads using a screen printing process or a jet-printing process. After pasting, the PCB is made available to a pick-and-place machine that places components (e.g., a QFN package) onto the appropriate locations of the PCB. The PCB along with the placed components is then subjected to a solder reflow process, in which the board is exposed to a sufficient temperature to melt the solder particles in the solder paste, thereby bonding the component leads to the pads on the circuit board. Surface tension of the molten solder keeps the components in place and automatically aligns the components on the pads.

Figure 1:
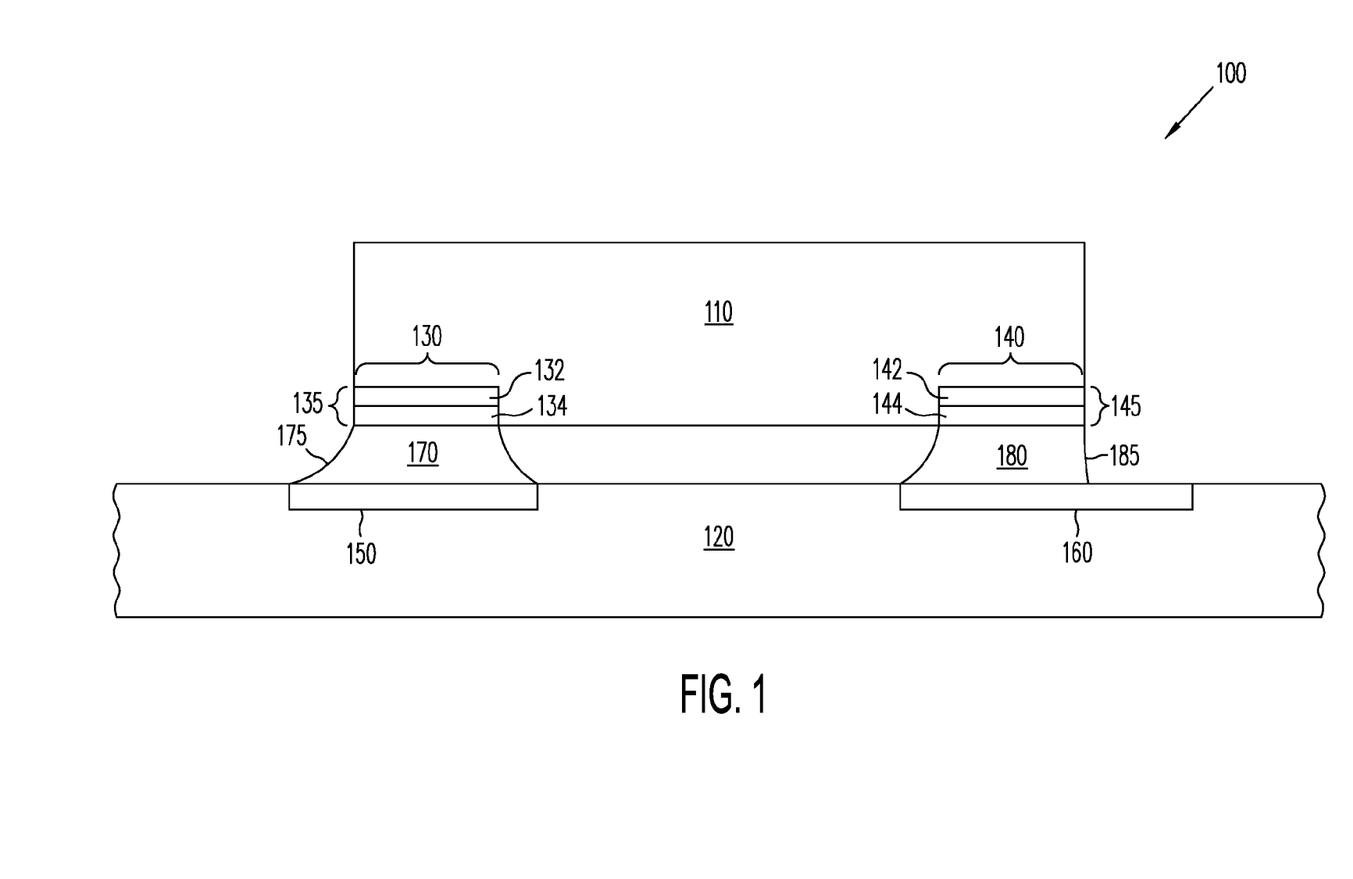
FIG. 1 is a simplified block diagram illustrating an assembly in which a semiconductor device package is mounted on a printed circuit board.

FIG. 1 is a simplified block diagram illustrating an assembly in which a semiconductor device package is mounted on a printed circuit board. In assembly 100, semiconductor device package 110 is mounted on PCB 120 using a solder reflow process, as described above. Semiconductor device package 110 can be, for example, a QFN package having electrical contacts 130 and 140. Electrical contact 130 includes a base metal 132 that is part of a lead frame used during manufacture of semiconductor device package 110. Base metal 132 can be a variety of electrically conductive metals, for example, copper. Electrical contact 130 further includes a plated metal 134 that is provided to enhance adhesion of reflowed solder to electrical contact 130. Examples of such plating metals include, for example, tin, gold, and silver, and alloys thereof. Similarly, electrical contact 140 includes a base metal layer 142 and a plated metal layer 144.

Electrical contacts 130 and 140 of the semiconductor device package are electrically coupled to PCB contacts 150 and 160 through solder connections 170 and 180. As discussed above, solder connections 170 and 180 are formed using a solder reflow process known in the art. During the solder reflow process, due to surface tension between the solder and the contact metals having an affinity for the solder, solder features 175 and 185 are formed. Due to the singulation process by which the QFN package is manufactured, the contact metals along the sides of semiconductor device package 110 (e.g., at contact sides 135 and 145) can be of irregular smoothness, be oxidized, and can also have an indeterminate amount of plating metal exposed. In the case of electrical contact 130, a sufficient amount of plating metal 134 is exposed along side surface 135 of the contact and the surface is of a sufficient smoothness to provide a well formed toe fillet in solder feature 175. On the other hand, the manufacturing process causes either an insufficient amount of plating metal, over oxidation, or an irregular surface on the side surface 145 of electrical contact 140, thereby preventing a well formed toe fillet from forming in solder feature 185.

A typical testing procedure to determine whether a PCB and its components have been assembled correctly is to optically inspect the PCB assembly. Optical inspection involves checking for missing or misaligned components and solder bridging. With regard to no-leads package mounting, an automatic optical inspection (AOI) process typically looks for a well-formed toe fillet as an indication of a good solder bond, since the underside of the components cannot be directly inspected. If the toe fillet is missing or is ill-formed, as with solder feature 185, then the component will not pass optical inspection, even though there may be a good electrical coupling along the underside of the component.

Figure 2:
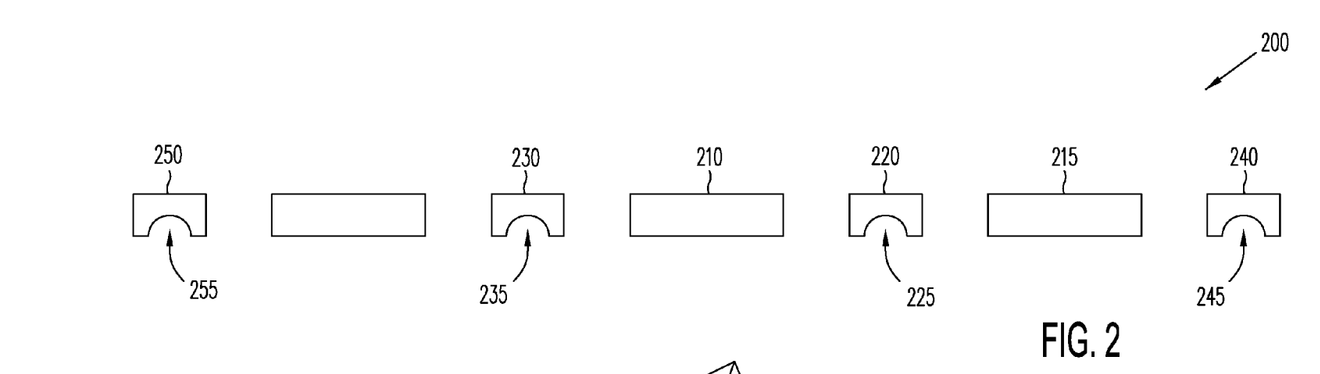
FIG. 2 is a simplified block diagram illustrating a cross-sectional view of a lead frame usable in conjunction with embodiments of the present invention.

FIG. 2 is a simplified block diagram illustrating a cross-sectional view of a lead frame usable in conjunction with embodiments of the present invention. Lead frame 200 includes a set of die pads (e.g., die pads 210 and 215) that are separated by a set of lead constructs (e.g., lead constructs 220, 230, 240, and 250). Lead frame 200 is constructed of an electrically conductive metal, for example, copper or a copper alloy. Since copper oxidation can impair adhesion of solder to leads of the lead frame during reflow operations, for example, one or both major surfaces of the lead frame can be plated with a solderable metal (e.g., tin, silver, gold, nickel, palladium, or an alloy thereof). Plating of the lead frame surfaces can be performed by the lead frame vendor during fabrication of the lead frame or by a manufacturer of a semiconductor device package incorporating the lead frame.

Figure 3:
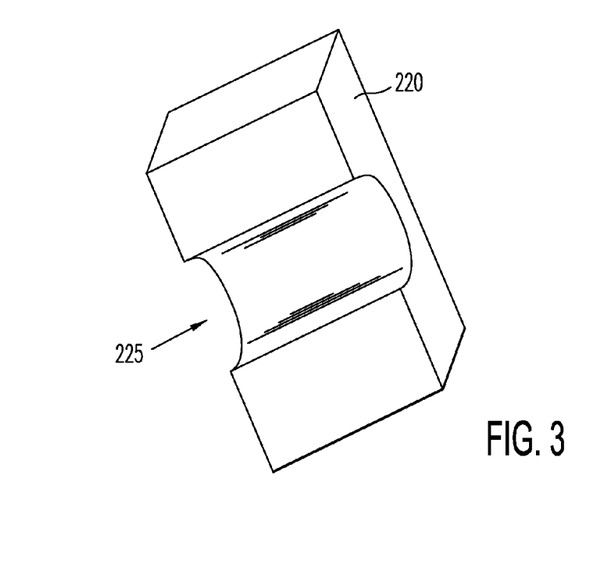
FIG. 3 is a simplified block diagram illustrating a perspective view of the bottom major surface of a lead construct that illustrates a lead feature extending across the width of lead construct.

Lead constructs 220, 230, 240, and 250 include a feature on the bottom surface (e.g., lead features 225, 235, 245, and 255, respectively). Lead features 225 and 235, for example, are symmetrical hollows formed on the bottom surface of the lead construct. FIG. 3 is a simplified block diagram illustrating a perspective view of the bottom major surface of lead construct 220. FIG. 3 illustrates lead feature 225 extending across the width of lead construct 220. The lead features can be formed in a variety of ways, including, for example, etching. In one embodiment, lead feature 225 is etched to a depth of about one half the thickness of lead construct 220. Plating of the lead frame with the solderable metal is performed subsequent to formation of the lead features, such that the plating metal can be deposited in the region of the lead feature.

Lead frame 200 can be formed using a variety of processes known in the art. For example, a copper blank can be patterned and etched to form the die pad, lead constructs, and lead features illustrated in FIGS. 2 and 3.

Figure 4:
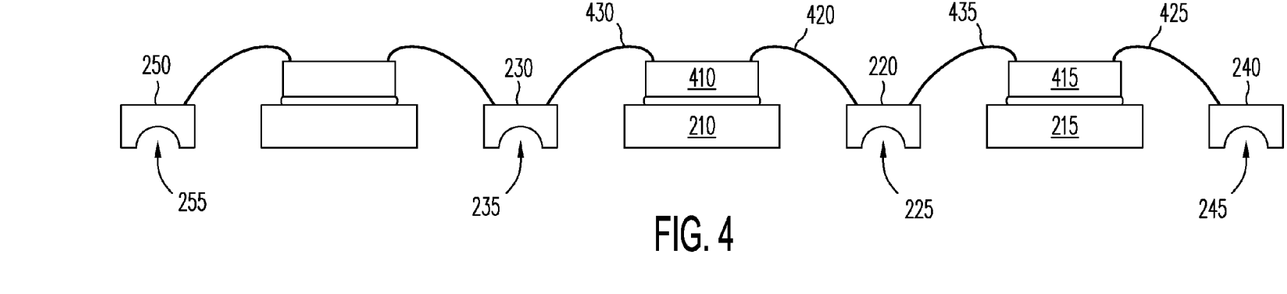
FIG. 4 is a simplified block diagram illustrating a cross-sectional view of the lead frame at a stage of assembly of a semiconductor device package, in accord with embodiments of the present invention.

FIG. 4 is a simplified block diagram illustrating a cross-sectional view of the lead frame at a stage of assembly of a semiconductor device package, in accord with embodiments of the present invention. Mounted on the die pads are corresponding semiconductor device die (e.g., semiconductor device die 410 and 415). The semiconductor device die can be adhesively coupled to the die pads by a variety of means known in the art, for example, a double-sided adhesive film or a conductive adhesive that allows for a thermal or electrical coupling between the semiconductor device die and the die pad. Alternatively, the semiconductor device die can be soldered to the die pads, or otherwise coupled. Electrical contacts on the unattached, active surface of the semiconductor device die (not shown) are electrically coupled to contact portions of the corresponding lead constructs by wire bonds 420, 430, 425, and 435.

Figure 5:
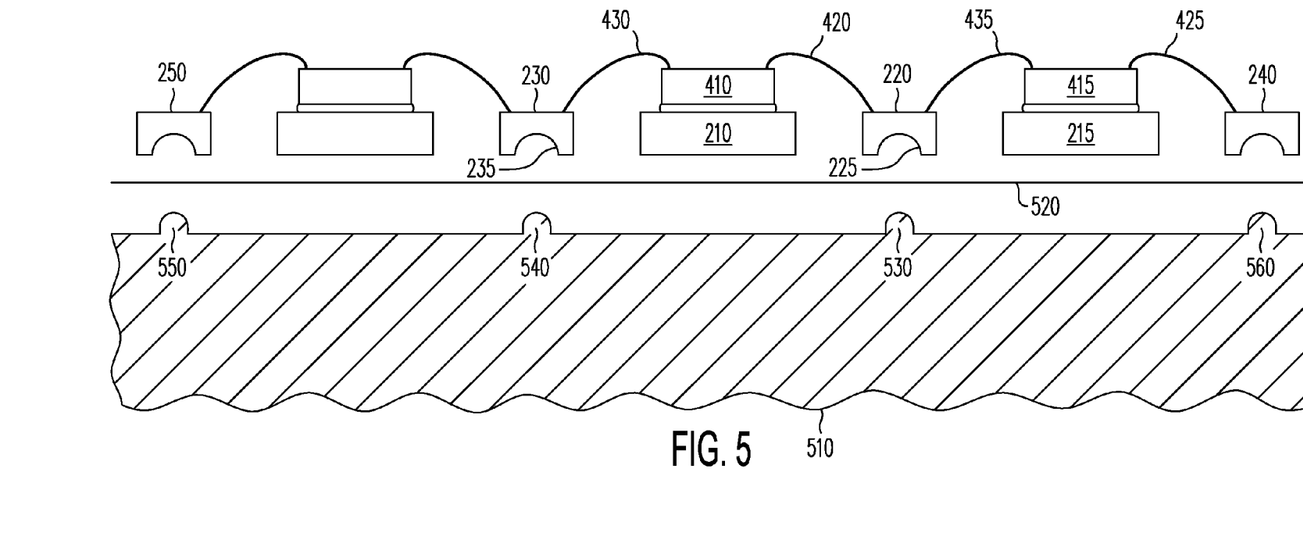
FIG. 5 is a simplified block diagram illustrating a cross sectional view of the lead frame at a further stage in assembly of the semiconductor device package, in accord with embodiments of the present invention.

FIG. 5 is a simplified block diagram illustrating a cross sectional view of the lead frame at a further stage in assembly of the semiconductor device package, in accord with embodiments of the present invention. A mold chase 510 provides a bottom portion of a mold region for semiconductor device package encapsulation. Mold chase 510 includes a set of mold chase features 530, 540, 550, and 560 that correspond to the lead features provided in lead assemblies 220, 230, 235, and 240, respectively. The mold chase features are configured for insertion into the corresponding lead features when lead frame 200 is placed onto mold chase 510.

Between lead frame 200 and mold chase 510 is a film 520. As will be described more fully with respect to FIG. 6, film 520 lies between mold chase 510 and lead frame 200 after lead frame 200 is placed on mold chase 510, such that film 520 conforms to the surfaces of the lead features. In one embodiment, film 520 is of a type used in film assisted molding. Film 520 is placed in the region between the mold chase and the lead frame prior to the lead frame being placed upon the mold chase, so that the film is sandwiched between the lead frame and the mold chase. In another embodiment, film 520 can be attached to the underside of lead frame 200. As lead frame 200 is placed upon mold chase 510, the mold chase features stretch and push the attached film onto the surface of the lead features in a conforming manner.

Figure 6:
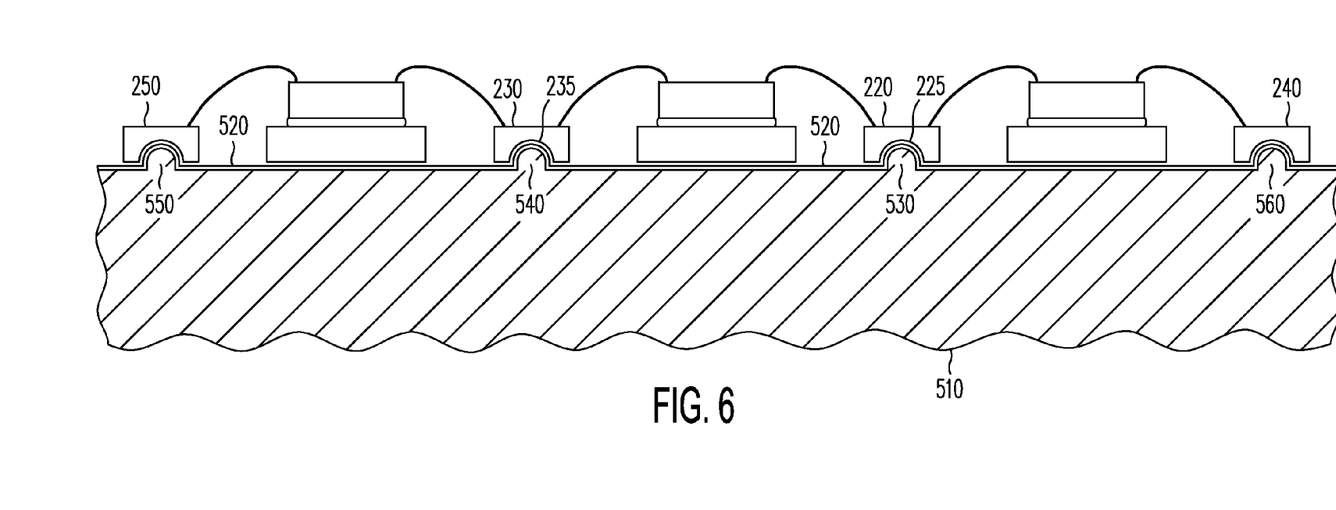
FIG. 6 is a simplified block diagram illustrating a cross-sectional view of the lead frame at a further stage in assembly of the semiconductor device package, in accord with embodiments of the present invention.

FIG. 6 is a simplified block diagram illustrating a cross-sectional view of the lead frame at a further stage in assembly of the semiconductor device package, in accord with embodiments of the present invention. As illustrated in FIG. 6, lead frame 200 is placed on mold chase 510, thereby sandwiching film 520 in a conforming manner between the lead frame and the mold chase. As discussed above, film 520 is pushed by mold chase features 530, 540, 550, and 560 into corresponding lead features 225, 235, 245, and 255. The combination of the mold chase features and the film prevent the lead features from receiving any encapsulant compound at later stages in the process.

Figure 7:
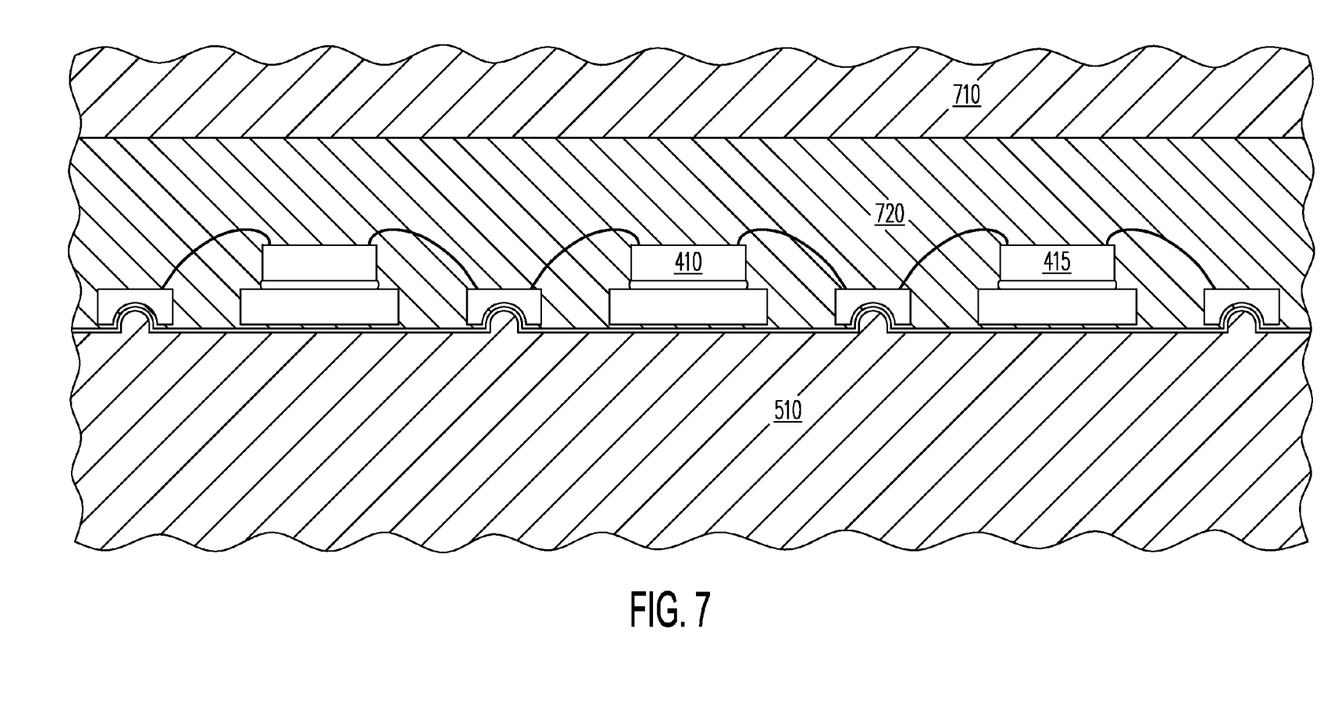
FIG. 7 is a simplified block diagram illustrating a cross-sectional view of the lead frame at a further stage in assembly of the semiconductor device package, in accord with embodiments of the present invention.

FIG. 7 is a simplified block diagram illustrating a cross-sectional view of the lead frame at a further stage in assembly of the semiconductor device package, in accord with embodiments of the present invention. An upper mold chase 710 is provided to create a cavity to receive a mold compound used to encapsulate all semiconductor device packages incorporating lead frame 200. Mold compound 720 is injected over and around lead frame 200 and all components and connectors installed thereon (e.g., semiconductor device die 410 and 415 and the wire bond couplings). Subsequent to the injection of the mold compound, pressure and heat can be applied to cure the encapsulant, thereby forming, for example, a panel or strip of encapsulated components and the lead frame. The mold chase features combined with the film prevent the mold compound from adhering to the bottom (as illustrated) surfaces of the lead features.

Mold compound 720 can be any appropriate encapsulant including, for example, silica-filled epoxy molding compounds, plastic encapsulation resins, and other polymeric materials such as silicones, polyimides, phenolics, and polyurethanes. As discussed above, once the molding material is applied, the panel or strip can be cured by exposing the materials to certain temperatures for a period of time, or by applying curing agents, or both, depending upon the nature of the encapsulant material and the components to be encapsulated.

Figure 8:
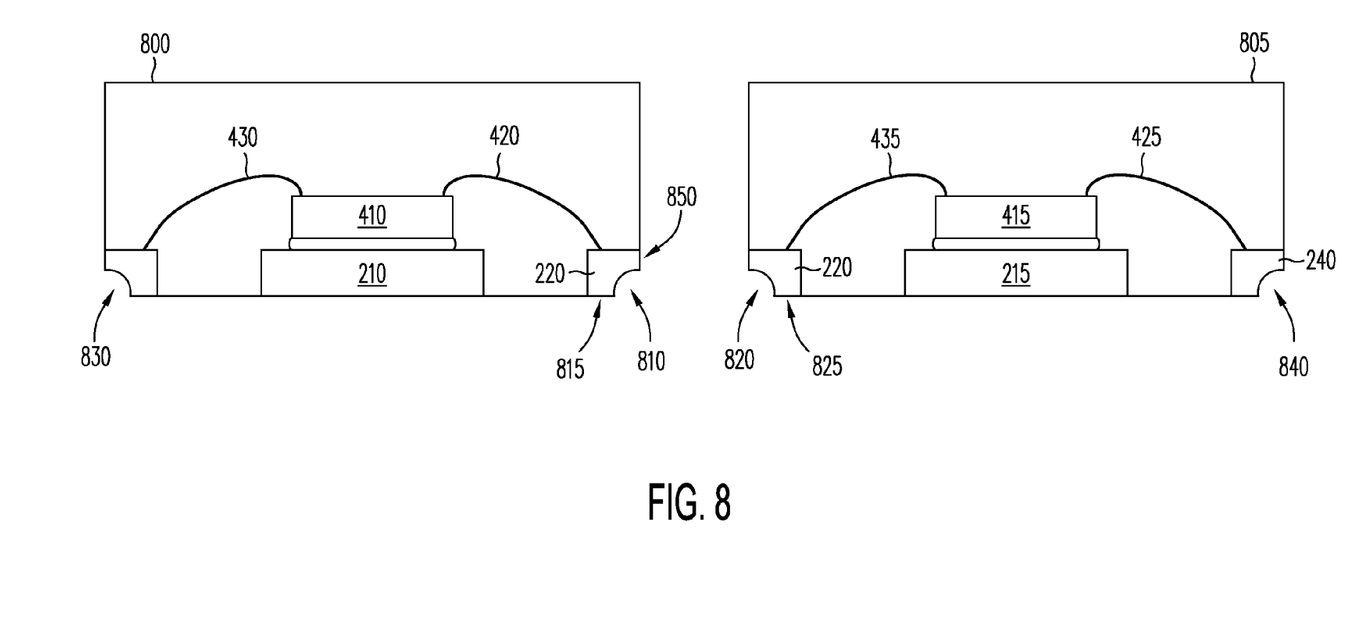
FIG. 8 is a simplified block diagram illustrating a cross-sectional view of semiconductor device packages incorporating embodiments of the present invention.

FIG. 8 is a simplified block diagram illustrating a cross-sectional view of semiconductor device packages 800 and 805 incorporating embodiments of the present invention subsequent to singulation of the semiconductor device package from the panel or strip formed by a process as illustrated in FIGS. 2-7. Singulation is performed by, for example, sawing through the panel at locations corresponding to mid-points of lead features.

Removal of semiconductor device package 800 and 805 from mold chase 510 and film 520 exposes electrical contact features 810, 820, 830, and 840. Electrical contact features 810 and 820 are part of lead assembly 220, split along the singulation line between semiconductor device packages 800 and 805. The portion of lead assembly 220 that is in semiconductor device package 800 provides not only electrical contact feature 810 but also bottom surface electrical contact 815. Electrical contact feature 810 and bottom surface electrical contact 815 provide a surface that is plated with solderable metal, thereby providing an opportunity for a good solder contact along the bottom and a good, optically-inspectable toe fillet in contact with the electrical contact feature.

The shape of the electrical contact features also provides a region where solder can bond to the surface without concern for a rough sawn surface. The electrical contact feature in surface 850 is sawn away from a region in which solder will have the highest likelihood of reflow due to surface tension. It should be noted that the shape of, for example, lead feature 225 and hence electrical contact features 810 and 820 is not limited to that illustrated in the figures. But a chosen shape should still provide for a region in which an optically-inspectable solder feature can form on a plated-solderable surface without the presence of rough surfaces or burrs caused by the singulation process.

Figure 9:
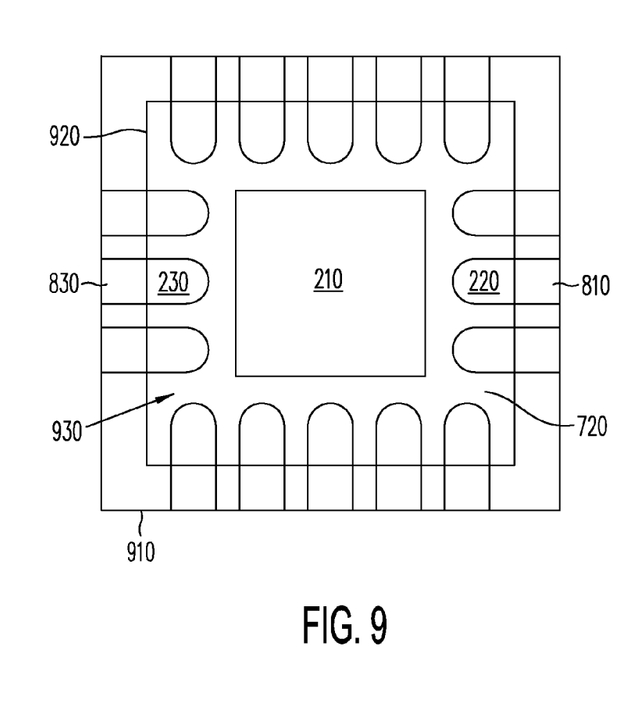
FIG. 9 is a bottom plan view of a semiconductor device package formed using embodiments of the present invention.

FIG. 9 is a bottom plan view of a semiconductor device package formed using embodiments of the present invention. Visible from the bottom is a major surface of die pad 210 exposed through encapsulant 720. Around a perimeter 910 of the semiconductor device package are exposed electrical contacts, including, for example, electrical contacts formed from lead assemblies 220 and 230. Perimeter line 920 indicates a transition between a bottom surface 930 of the semiconductor device package and a curved region formed around the perimeter of the package between perimeter line 920 and package perimeter 910. The curved region is of a same shape as that provided by, for example, electrical contact feature 810 and 830.

Figure 10:
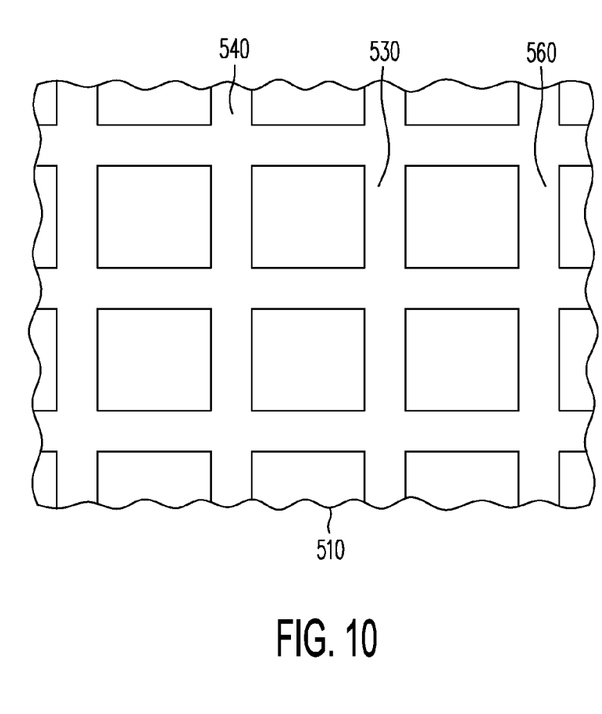
FIG. 10 is a simplified block diagram illustrating a portion of a mold chase, usable in conjunction with embodiments of the present invention.

FIG. 10 is a simplified block diagram illustrating a portion of mold chase 510, usable in conjunction with embodiments of the present invention. In order to provide conforming features in the mold chase for the corresponding lead features (e.g., lead feature 225) a set of rounded humps are formed on the surface of the mold chase in the illustrated pattern. For example, mold chase features 530, 540, and 560 form columns of rounded features on the mold chase. There is a corresponding set of rounded row features on the mold chase. The mold features are present in the perimeter regions of the ultimate semiconductor device packages to be formed using the embodiments of the present invention are not limited to a school where shape such as that illustrated in FIG. 10.

One advantage of an embodiment of the present invention is that embodiments can incorporate a standard lead frame such as a bottom half etched style QFN lead frame (e.g., as illustrated in FIG. 2). Use of film 520 along with mold chase 510 allows such a lead frame to be incorporated in a different manner than traditionally found. Thus, incorporation of AOI enhancing features can be provided in a semiconductor device package without major retooling by either manufacturers or customers. Further, since a pre-plated lead frame can be used, embodiments of the present invention do not require additional plating steps that other methods require in order to provide similar AOI features. In addition, the shape of the provided lead frame only requires a single cut to singulate packages and still provide a solder wettable surface that allows for AOI.

By now it should be appreciated that there has been provided a method of making a semiconductor device package. The method includes: providing a lead frame comprising one or more leads having a lead feature formed in a first major surface of the one or more leads, where the lead feature is exposed on the side surfaces of the one or more leads and the first major surface is an external contact surface of the semiconductor device package; placing the lead frame on a mold chase, where the mold chase includes one or more mold features that correspond to each lead feature of the lead frame and each mold feature conforms to each corresponding lead feature; positioning a film between the one or more lead features and the corresponding mold features where the film conforms to each of the one or more lead features after placing the lead frame on the mold chase; forming an encapsulant over and around the lead frame and any other components included in the semiconductor device package; and, singulating the semiconductor device package on a plane through a portion of a lead feature.

One aspect of the above embodiment further includes plating the first major surface of the lead frame with a solderable metal prior to placing the lead frame on the mold chase. A further aspect includes removing the film subsequent to singulation in order to expose the plated first major surface of the one or more leads and the corresponding lead features. In yet a further aspect the method includes: electrically coupling the semiconductor device package to a printed circuit board, where the electrically coupling includes performing a solder reflow between electrical contacts on the printed circuit board and external contacts surfaces of the semiconductor device package; and, forming an optically-inspectable solder feature between an electrical contact on the printed circuit board and the lead feature during the electrical coupling. In another aspect, the solderable metal includes one or more of tin, gold, silver, nickel, and palladium.

Another aspect of the above embodiment further includes forming the lead frame using an etching process, where lead feature has a maximum depth less than or equal to half a thickness of a corresponding lead of the one or more leads. In a further aspect, the lead feature includes a semicircular cross sectional shape. In another aspect, the lead frame includes copper and is plated with a solderable metal on a major surface of the one or more leads and surfaces of the corresponding lead features.

Another aspect of the above embodiment further includes: coupling a major surface of a semiconductor device die to a portion of the lead frame; and, electrically coupling an electrical contact of the semiconductor device die to one or more of the leads, where the portion of the lead frame includes a die pad and forming the encapsulant further includes forming the encapsulant over and around the semiconductor device die. In a further aspect, said electrically coupling the electrical contact of the semiconductor device die to one or more of the leads, includes forming one or more wire bonds between the electrical contact of the semiconductor device die and the one or more leads and forming the encapsulant further includes forming the encapsulant over and around the one or more wire bonds.

In another aspect of the above embodiment, said singulating the semiconductor device package, further includes separating the semiconductor device package from a neighboring semiconductor device package through a plane substantially perpendicular to a major surface of the semiconductor device package where the plane is through one or more of the lead features on a perimeter of the semiconductor device package. In a further aspect, the separating results in a solderable surface along the lead feature of each exposed lead.

In still another aspect of the above embodiment, the positioning of the film between the one or more lead features and the corresponding mold features includes attaching a film on the first major surface of the one or more leads. Placing the lead frame on the mold chase pushes the film onto a surface of the lead features such that the film conforms to the surface of the lead features. In a different aspect of the above embodiment the positioning of the film between the one or more lead features and the corresponding mold features includes placing a film-assisted molding film between the lead frame and the mold chase. Placing the lead frame on the mold chase conforms the film assisted molding film to the lead frame and the mold chase.

Another embodiment of the present invention provides a method of forming a semiconductor device package that includes: forming a lead portion of a lead frame, where the lead portion includes a top major surface and a bottom major surface, the bottom major surface includes a lead feature, and the lead feature extends a width of the lead portion; plating the lead portion of the lead frame with a solderable metal, where the solderable metal coats a surface of the lead feature and the bottom surface of the lead portion; placing the lead portion of the lead frame on a mold chase, where mold chase feature conforms to the lead feature; placing a film between the bottom surface of the lead portion and the mold chase prior to said placing the lead portion of the lead frame on the mold chase, where the film conforms to the surface of the lead feature upon said placing the lead portion of the lead frame on the mold chase; and forming an encapsulant over and around the lead portion of the lead frame, where the film prevents encapsulant from forming in the lead feature.

One aspect of the above embodiment further includes etching the lead feature on the lead portion, where the lead feature has a maximum depth less than or equal to half a thickness of the lead portion. Another aspect of the above embodiment further includes removing the film subsequent to forming the encapsulant, where the removing exposes the plated surface of the lead feature. Still another aspect of the above embodiment further includes cutting the encapsulant and the one or more leads along a plane passing through a cross section of the lead feature. In a further aspect, the plated surface of the lead feature provides a solderable surface subsequent to said cutting.

Another aspect of the present invention provides a method for forming a printed circuit board comprising a semiconductor device package made using the above embodiment. The method includes forming a first solder bond between a portion of the bottom major surface of the lead portion and a contact pad on a surface of the printed circuit board, and forming a second solder bond between at least a portion of the plated surface of the lead feature and the contact pad on the surface of the printed circuit board. The second solder bond is of a size and shape sufficient to pass an automatic optical inspection.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, a shape of the lead feature can have a symmetric cross section other than a semicircle. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a semiconductor device package, the method comprising:
   providing a lead frame comprising one or more leads having a lead feature formed in a first major surface of the one or more leads, wherein
      the lead feature is exposed on side surfaces of the one or more leads, and
      the first major surface is an external contact surface of the semiconductor device package;
   placing the lead frame on a mold chase, wherein
      the mold chase comprises one or more mold features that correspond to each lead feature of the lead frame, and
      each mold feature conforms to each corresponding lead feature;
   positioning a film between the one or more lead features and the corresponding mold features wherein the film conforms to each of the one or more lead features after said placing the lead frame on the mold chase;
   forming an encapsulant over and around the lead frame and any other components included in the semiconductor device package; and
   singulating the semiconductor device package on a plane through a portion of a lead feature.

2. The method of claim 1 further comprising:
   plating the first major surface of the lead frame with a solderable metal prior to said placing the lead frame on the mold chase.

3. The method of claim 2 further comprising:
   removing the film subsequent to said singulating to expose the plated first major surface of the one or more leads and the corresponding lead features.

4. The method of claim 3 further comprising:
   electrically coupling the semiconductor device package to a printed circuit board, wherein said electrically coupling comprises performing a solder reflow between electrical contacts on the printed circuit board and external contact surfaces of the semiconductor device package; and
   forming an optically-inspectable solder feature between an electrical contact on the printed circuit board and a lead feature during said electrically coupling.

5. The method of claim 2 wherein the solderable metal comprises one or more of tin, gold, silver, nickel, and palladium.

6. The method of claim 1 further comprising
   forming the lead frame using an etching process, wherein a lead feature comprises a maximum depth less than or equal to half a thickness of a corresponding lead of the one or more leads.

7. The method of claim 6 wherein the lead feature comprises a semicircular cross sectional shape.

8. The method of claim 6 wherein the lead frame comprises copper and is plated with a solderable metal on a major surface of the one or more leads and surfaces of the corresponding lead features.

9. The method of claim 1 further comprising:
   coupling a major surface of a semiconductor device die to a portion of the lead frame; and
   electrically coupling an electrical contact of the semiconductor device die to one or more of the leads, wherein the portion of the lead frame comprises a die pad, and
      said forming the encapsulant further comprises forming the encapsulant over and around the semiconductor device die.

10. The method of claim 9 wherein said electrically coupling the electrical contact of the semiconductor device die to one or more of the leads comprises:
    forming one or more wire bonds between the electrical contact of the semiconductor device die and the one or more leads, and
    said forming the encapsulant further comprises forming the encapsulant over and around the one or more wire bonds.

11. The method of claim 1 wherein said singulating the semiconductor device package comprises:
    separating the semiconductor device package from a neighboring semiconductor device package through a plane substantially perpendicular to a major surface of the semiconductor device package, wherein the plane is through one or more of the lead features on a perimeter of the semiconductor device package.

12. The method of claim 11 wherein said separating results in a solderable surface along the lead feature of each exposed lead.

13. The method of claim 1 wherein said positioning the film between the one or more lead features and the corresponding mold features comprises:
    attaching a film on the first major surface of the one or more leads, wherein said placing the lead frame on the mold chase pushes the film onto a surface of the lead feature such that the film conforms to the surface of the lead feature.

14. The method of claim 1 wherein said positioning the film between the one or more lead features and the corresponding mold features comprises:
    placing a film assisted molding film between the lead frame and the mold chase, wherein said placing the lead frame on the mold chase conforms the film assisted molding film to the lead frame and the mold chase.

15. A method of forming a semiconductor device package, the method comprising:
    forming a lead portion of a lead frame, wherein
      the lead portion comprises a top major surface and a bottom major surface,
      the bottom major surface comprises a lead feature, and
      the lead feature extends a width of the lead portion;
    plating the lead portion of the lead frame with a solderable metal, wherein the solderable metal coats a surface of the lead feature and the bottom surface of the lead portion;
    placing the lead portion of the lead frame on a mold chase, wherein a mold chase feature conforms to the lead feature;
    placing a film between the bottom surface of the lead portion and the mold chase prior to said placing the lead portion of the lead frame on the mold chase, wherein the film conforms to the surface of the lead feature upon said placing the lead portion of the lead frame on the mold chase; and
    forming an encapsulant over and around the lead portion of the lead frame, wherein the film prevents encapsulant from forming in the lead feature.

16. The method of claim 15 further comprising:
    etching the lead feature on the lead portion, wherein the lead feature has a maximum depth less than or equal to half a thickness of the lead portion.

17. The method of claim 15 further comprising:
removing the film subsequent to said forming the encapsulant, wherein said removing exposes the plated surface of the lead feature.

18. The method of claim 15 further comprising:
cutting the encapsulant and one or more leads along a plane passing through a cross section of the lead feature.

19. The method of claim 18 wherein the plated surface of the lead feature provides a solderable surface subsequent to said cutting.

20. A method for forming a printed circuit board comprising a semiconductor device package made using the method of claim 19, the method comprising:
forming a first solder bond between a portion of the bottom major surface of the lead portion and a contact pad on a surface of the printed circuit board; and
forming a second solder bond between at least a portion of the plated surface of the lead feature and the contact pad on the surface of the printed circuit board, wherein the second solder bond is of a size and shape sufficient to pass an automatic optical inspection.

\* \* \* \* \*